United States Patent [19]

Pointon et al.

[11] 3,951,250

[45] Apr. 20, 1976

[54] CAPACITIVE KEY FOR ELECTRONIC CIRCUIT

[75] Inventors: Peter Pointon; Ian Robert Prince; Wolfgang Bial, all of West Molesey, England

[73] Assignee: Alphameric Keyboards Limited, England

[22] Filed: Apr. 8, 1974

[21] Appl. No.: 459,235

[30] Foreign Application Priority Data

Apr. 6, 1973 United Kingdom............... 16644/73
July 17, 1973 United Kingdom............... 34032/73

[52] U.S. Cl. .............................. 197/98; 179/90 K; 200/159 R; 235/145 R; 340/365 C
[51] Int. Cl.² ...................... B41J 5/12; H01H 3/12
[58] Field of Search.............. 178/79, 81; 179/90 K; 197/17, 98; 200/52 R, DIG. 1, 159, 267–269, 279, 292; 235/145, 146; 307/88 ET; 340/365 R, 365 C

[56] References Cited

UNITED STATES PATENTS

| 3,659,163 | 4/1972 | Borisov et al. ................. 340/365 C |
| 3,670,129 | 6/1972 | Cherry et al. .................... 200/267 X |
| 3,696,908 | 10/1972 | Gluck et al. ........................... 197/98 |
| 3,735,068 | 5/1973 | Yanaga et al. .................. 200/279 X |
| 3,797,630 | 3/1974 | Zilkha................................... 197/98 |

FOREIGN PATENTS OR APPLICATIONS 1,185,676    3/1970    United Kingdom............ 340/365 C

OTHER PUBLICATIONS

*Handbook of Chemistry and Physics*, p. E-60, Properties of Dielectrics, 55th Edition, 1974.
A. S, Farber et al., "Detecting Key Depression", IBM Technical Disclosure Bulletin, Vol. 12, No. 11, Apr. 1970, pp. 1876–1877.
R. Abbatecola et al., "Threshold Capacitive Key", IBM Technical Disclosure Bulletin, Vol. 13, No. 11, Apr. 1971, pp. 3301–3302.

*Primary Examiner*—Robert E. Bagwill
*Assistant Examiner*—Paul T. Sewell
*Attorney, Agent, or Firm*—Cushman, Darby & Cushman

[57] ABSTRACT

In a keyboard for an electronic circuit having a striker on each key formed of electronic material which is conductive or carries a conductor and which is moved downwardly towards a fixed conductor assembly to provide capacitive coupling, it is found that electrostatic charges can be generated by operation of a key which give spurious outputs. The present invention provides constructions for reducing the effects of such charges.

4 Claims, 4 Drawing Figures

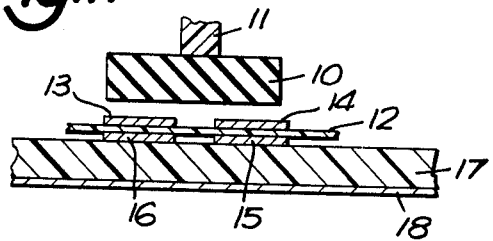
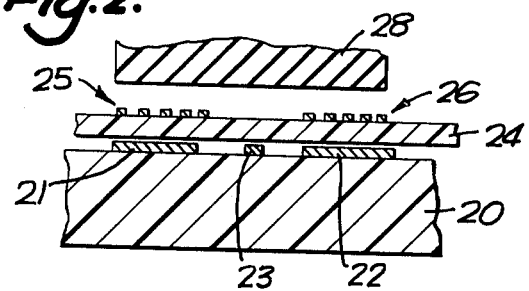
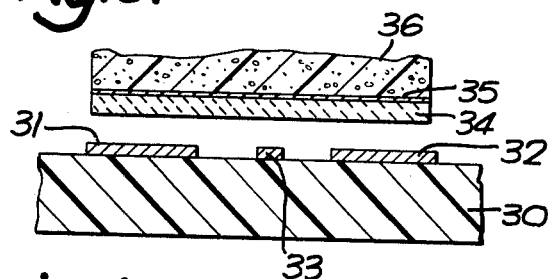
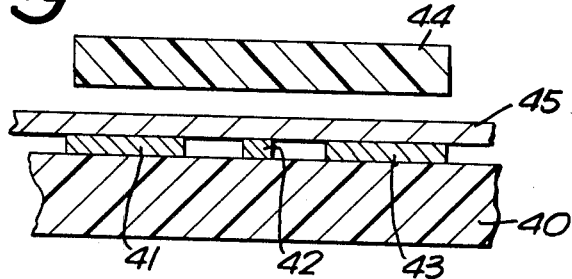

CAPACITIVE KEY FOR ELECTRONIC CIRCUIT

BACKGROUND OF THE INVENTION

1. Field of the Invention.

This invention relates to keyboards for electronic circuits and is concerned more particularly with a keyboard of the kind in which a key, when depressed, moves an elastomeric conducting element into contact with or in proximity to two conductive regions on a printed circuit element.

2. Prior Art.

In such a keyboard, the elastomeric member which may be a conductive elastomer or may carry a metal plate or metal/plastics laminate or otherwise be made conductive on or near its surface either makes a conductive (possibly resistive) connection or capacitive coupling between the two conductive regions on the printed circuit board. One such keyboard is described in application Ser. No. 161,611 of S. Zilkha, filed July 12th 1971 now U.S. Pat No. 3,797,630. It may be preferred in such an arrangement to provide a thin sheet of insulating material to form a coverlay over the conductive elements thereby ensuring that the coupling is capacitive. This eliminates many of the problems due to possible incomplete contact between the conductive elastomeric material and the conductive regions on the printed circuit board.

SUMMARY OF THE INVENTION

There is however a charge phenomenon associated with the use of a conductive elastomeric striker on a dielectric material which can, in certain circumstances cause erroneous operation. Particularly if the key is hit very hard, charge can build up on the surface of the dielectric material and/or on the dielectric. Such a charge may arise from various electrostatic generating mechanisms. When the key is released, the area of contact between the elastomeric material an the dielectric gradually reduces because inevitably there are small surface irregularities on one or both of these elements. As the charge becomes more localised, the voltage increases and this voltage may build up to a magnitude such as to give rise to a pulse which affects the electronic system to which the keyboard is connected. This pulse may occur at a random time and, in a system in which rows and/or columns of keys are scanned in sequence using a time sharing system, such a pulse signal may give rise to a spurious input to the electronic circuits indicating depression of a key which has not been depressed. It is an object of the present invention to prevent such pulses being formed such as might affect the electronic system.

According to one aspect of the present invention, in a keyboard having keys each carrying a conductive elastomeric element which is movable by the key towards conductive elements on a fixed member to effect capacitive and/or condutive coupling therebetween, the fixed member comprises either a dielectric material having sufficient surface conductance to equalise local charge variations on the surface thereof struck by the elastomeric element or within the dielectric material, the conductive elements being on the other surface of the dielectric or, alternatively, the fixed member comprises dielectric material with conductive regions on its upper surface to be directly contacted by the elastomeric member, at least one of these regions being located opposite a conductive element on or immediately adjacent to the other side of the dielectric.

By making the surface of the dielectric material sufficiently conductive or by putting conductive regions on this surface, localised charges cannot build up, either on the dielectric material or the elastomeric material, when the conductive striker is near the surface of the dielectric material as the charges are dispersed over the surface.

In one construction, the keyboard has a dielectric sheet with, beneath each key, two or more fully or partially metallised areas on the surface of the dielectric forming conductive regions to be contacted by the conductive elastomeric member. Beneath the dielectric sheet, possibly on a printed circuit board or rigid member, but preferably on the under surface of the dielectric sheet, there is at least one conductive element underneath one of the metallised areas on the upper surface so as to form a capacitor.

There may be conductive elements under both the metallised regions so that the elastomeric member, when in contact with the metallised regions on the upper surface of the dielectric, provides capacitive coupling between the conductive elements. In such an arrangement with two conductive elements on or adjacent to the underside of the dielectric, the keys may be arranged in a matrix in rows or columns with one conductive element for each key being connected in a row circuit and the other conductive element for the key being connected in a column circuit. Drive signals may be applied, for example in time sequence, to the various row circuits and thus the time phase of an output on a column circuit, provided by the capacitive coupling through a key, identifies the key. If there are two conductive elements on the under surface of the dielectric or on a rigid member below the dielectric, then the capacitive coupling is formed by the capacitance between one of the conductive elements and the metallising on the top and thence through the elastomeric conductive member (which may provide conductive or possibly capacitive coupling to the other metallised area) and through the further capacitance between the second metallised area and the other conductive element.

If only a single conductive element is used on the underside of the dielectric sheet, then, on the upper side of the dielectric sheet there is a metallised area over this conductive element and a second metallised area on the sheet adjacent to the first area, these two metallised areas being bridged by the elastomeric conducting member of the key. In such an arrangement, one conductive area on the underside of the dielectric sheet may be connected for example in row circuits and the second metallised areas (that is the ones not above said one conductive element) on the upper side of the sheet are connected in the column circuits. It will be appreciated that, electrically, the rows and columns may be interchanged and that row circuits may be used for the drive signals and column circuits for the outputs or vice versa. Variations in the capacitance between the two metallised regions are not of significance for circuit operation. It is immaterial for circuit operation whether the coupling between these metallised regions is capacitive or resistive. However any resistive contact further serves to discharge or equalise the spurious charges over the region of both metallised areas.

In a system having row and column drives to conductive areas on one face of a dielectric sheet of printed circuit board, it may be necessary to provide grounded screens between the two conductive areas for each key.

Most conveniently, the dielectric material is formed as a flexible single-sided or double-sided printed circuit laminate. To provide support, it may be adhered to a rigid support board on its underside. This board may be a printed circuit board. Typically the flexible laminate is of polyester or polyimide or polyethylene or polytetrafluoroethylene which might be 0.001 to 0.005 inches thick. The required metallised areas may be formed by etching of the metal of the laminate. The rigid support board may be of resin-bonded glass fibre material or laminate with or without a printed circuit, preferably having a metal cladding on the under surface to act as an grounded plane and screening for the printed circuit sheet.

If the dielectric material is made to have a low surface resistance, typically material having a resistance between $10^6$ and $10^{12}$ ohms per square may be employed. Suitable materials for this purpose are flexibilised polyvinylchloride, phenolic varnishes, certain epoxy formulations, amino resins such as melamine, cellulose acetate, polyamides and polychlorotrifluoroethylene, some or all of which may be doped. In this case, the dielectric material may have metallised regions on its undersurface or these may be formed on a separate printed circuit board with a dielectric sheet material lying immediately over the top of the printed circuit board.

The striker may consist of an elastomeric element which is rendered conductive at or near its lower surface, which is covered by a dielectric material. This dielectric material has its surface rendered slightly conductive or is made conductive in a number of areas. The striker co-operates with two conductive elements in the fixed structure which elements are covered by a thin layer of dielectric material, the striker forms a capacitor coupling when moved towards these fixed elements.

According to another aspect of the present invention, in a keyboard having keys each carrying a conductive striker element which is movable by the key towards conductive elements on a fixed member to effect capacitive and/or conductive coupling therebetween, the fixed member comprising dielectric material with conductive regions on its upper surface to be directly contacted by the striker element and with at least one of these regions being located opposite a conductive element on or immediately adjacent the other side of the dielectric, the aforementioned conductive regions on the upper surface of the dielectric material are formed each as areas having a pattern of conductive and non-conductive portions. The conductive portions in the pattern may be discrete areas or they may be interconnected, for example to form a network surrounding discrete non-conductive areas. It is found that such an arrangement very substantially reduces any possibility of multiple signals being produced on depression of the key. The exact reason why this improvement is obtained is not at present fully understood, but it is believed that the striker intermittently contacts the capacitive area on the way down. This can produce multiple signals. If this conductive area is sub-divided, then the intermittency will only affect a small amount of capacitance, thereby only affecting the output signal to a correspondingly small extent. These small variations, if they are within the hysteresis range of the receiving circuit, will not switch the output. Instead of forming the conductive region as a pattern of conductive and non-conductive areas, it is alternatively possible to shape the surface of the conductive striker member so as to form a plurality of contacting areas; for example an elastomeric striker member formed of a conductive elastomer may be scored or grooved to form a patterned surface having a plurality of upstanding regions forming contact areas.

According to another aspect of the present invention, in a keyboard having keys, each key carrying a striker element which is movable by the key towards conductive elements on a fixed member to effect capacitive coupling therebetween, the striker element comprises a ceramic plate on a support including a resilient element, with metallising on the surface of the ceramic plate opposite to the striking surface of the plate, the ceramic plate being formed of a substantially non-conductive ceramic material having a dielectric constant between 20 and 4000, the metallising making the surface of the plate remote from the striking surface conductive. With this arrangement, there is no need to provide any dielectric cover over the conductive surfaces on the fixed member. The fixed member may be for example a printed circuit board having conductive regions; conveniently, for each key there are two conductive regions which are bridged by the ceramic plate on the key. Preferably however these two regions are separated from one another by an area including a grounded conductive region to reduce the direct capacitance between the two regions to be capacitively bridged by the key. With this construction therefore the keyboard may be formed of keys, each having a striker with a ceramic plate metallised on one surface, the keys being mounted so that the non-metallised surface of the striker makes contact directly with conductive regions on a printed circuit board.

The invention furthermore includes within its scope a keyboard having keys each carrying a resistive striker element which is movable by the key towards conductive elements on a fixed member to effect capacitive coupling therebetween, the fixed member including a dielectric material having sufficient surface conductance to equalise a charge variation on the surface thereof struck by the striker element, the conductive elements being on the other side of the dielectric or alternatively the fixed member comprising a dielectric material with conductive regions on its upper surface to be directly contacted by the striker member, at least one of these regions being located opposite a conductive element on or immediately adjacent the other side of the dielectric, wherein the striker member is formed of a semi-conducting ceramic. One convenient form of semi-conductive ceramic which may be employed is the material known as "polyceramic" and formed from a polyacrylic acid reacted with glass; such material typically has a resistivity of about 700 ohm-cm. However other semi-conductive ceramic, such as for example a reduced rutile, may be used for the striker member. Preferably the semi-conductive ceramic striker element is mounted on a resilient mount to ensure that the striker element can align with the surface against which it strikes.

BRIEF DESCRIPTION OF THE DRAWINGS

FIGS. 1, 2, 3 and 4 illustrate four embodiments, of the invention, each figure showing diagrammatically in vertical section part of the striker element of a key together with part of the fixed co-operating structure in an electronic keyboard. In the drawings, for the sake of clarity, the thicknesses of some of the layers or components have been greatly exaggerated.

FIG. 1 is a diagrammatic section showing a conductive elastomeric member 10 mounted on a plunger 11 of a key so as to be movable towards and away from a co-operating printed circuit element. This printed circuit element comprises a flexible dielectric sheet 12 of thickness 0.001 to 0.005 inches having printed circuits formed by metallisation on both faces. Associated with each key, there are, on the upper face of the sheet 12, two conductive areas 13, 14 which may or may not be subdivided and which are situated underneath the member 10 to be bridged thereby when the key is depressed onto the upper face of the printed circuit sheet 12. On the underside of the sheet 12, in the region immediately underneath the element 14, is a metallised area 15 and there is also a metallised area 16 underneath the element 13 for mechanical reasons in supporting the sheet 12 but electrically this area 16 may or may not be employed. The metallisation is conveniently copper or aluminium, which may be plated if necessary to reduce corrosion. The flexible sheet 12 with its metallisation is supported on a rigid board 17, typically formed of resin bonded glass fibre material having metallisation 18 on its lower surface to form a conductive grounded screen. Instead of forming the areas 15, 16 on the dielectric material, these conductive elements may be formed on the upper surface of board 17.

The various keys are arranged in rows. As is the normal practice, the keys in adjacent rows may be staggered but electrically the keys may be considered to form a matrix of rows and columns. The elements 13 or the elements 16 of all the keys in one row are connected together in a row circuit and similar row circuits are provided for the various other rows of keys. The electrical elements 15 for each column of keys are connected together in column circuits. In the keyboard, in the known way, the various row circuits are energised by short duration pulse signals separately in a cyclic sequence. When a key is depressed, the elastomeric conductive member 10 bridging the elements 13, 14 provides a coupling between these two elements. The capacitance between elements 14, 15 and between elements 13, 16 might typically capacitances 18pF. When the key is depressed, these two capcitances are in series and the coupling between 13 and 14 does not materially alter the capacitance of the circuit which is determined primarily by the small capacitance between 14 and 15 and between 13 and 16. However when the key is depressed, there is then coupling between 13 and 15 or 16 so that a drive signal applied to a row circuit can be sensed on the appropriate column circuit. The time phase of this signal identifies the row and thus the outputs from the various column circuits are signals representative of the individual keys which are depressed.

In the arrangement illustrated in FIG. 1, because there are metallised regions 13, 14 on the upper surface of the dielectric, there is no possibility of charges accumulating in very localised regions underneath the elastomeric member 10 and thus the problem of spurious pulse signals produced when the key is released is avoided.

In FIG. 2 there is shown part of a printed circuit board 20 having conductive elements on its upper surface. In this particular embodiment, for each key there are two conductive elements 21, 22 spaced apart from one another and with a grounded conductive element 23 extending between the two elements 21 and 22 to minimize coupling therebetween. Over the surface of the conductive elements 21, 22, 23 is a sheet 24 of dielectric material which is formed as a flexible printed circuit laminate. Conveniently it is made of polyester or polyimide or polyethylene or polytetrafluoroethylene and might be from 0.001 to 0.005 inches thick. It has on its upper surface two regions 25, 26 of conductive material. Each of these regions is formed of a number of discrete areas of conductive material, typically squares having dimensions larger than 0.015 inches. On the key there is a striker element 28 formed of a conductive elastomeric material.

Although only one key is shown in FIG. 2, in a keyboard, there would be a plurality of keys arranged in rows. The keys in adjacent rows may be staggered but electrically the keys may be considered to form a matrix of rows and columns. The conductive elements 21 on the printed circuit board are connected in row circuits and the conductive elements 22 are connected in column circuits. When the key is depressed, the conductive elastomeric member provides a resistive connection or possibly capacitive connection between the conductive areas of 25 and 26 and hence provides the capacitive coupling between the conductive elements 21, 22. In the keyboard, in the known way, the various row circuits are energised by short duration pulse signals separately in a cyclic sequence. When a key is depressed, this capacitive coupling couples one of the rows to one of the columns. The time-phase of the drive signal identifies the row and thus the outputs in the various column circuits are signals representative of the individual keys which are depressed.

In the modified form of construction shown in FIG. 3, the printed circuit board 30 as before has, for each key conductive elements 31, 32 separated by a grounded conductor 33. On each key there is a striker plate 34 formed of ceramic material having dielectric constant between 20 and 4000. The upper surface of the plate 34 is metallised as shown at 35 to give the plate surface conductance. The plate 34 is mounted on a resilient foam element 36 permitting alignment of the plate 34 with the conductive elements 31, 32 when the key is depressed. With this construction, there is no need to provide a dielectric sheet (such as the sheet 24 of FIG. 2) over the printed circuit elements. It is found that a thin ceramic plate with metallising on one surface has adequate shock resistance to withstand the impacts on the conductive elements. When the key is depressed, the metallised layer in conjunction with the dielectric ceramic material provides capacitive coupling between the row and column circuits.

FIG. 4 illustrates yet another construction of keyboard. As before there is a printed circuit board 40 having conductive elements 41, 43 on its upper surface separated by a grounded conductor 42. Over these conductive elements is a flexible sheet or coverlay 45 of plastics material which is non-conducting. On the key is a striker 44 formed of resistive material; in this particular embodiment, material known as "polyceramic" and formed by reaction of a polyacrylic acid with glass is employed: such material typically has a resistivity of 700 ohm-cm. The polyceramic is a rigid material and is therefore mounted on a resilient mount for example a plastics foam mount. In operation, when the key is depressed, the polyceramic material is separated by the plastics sheet 45 from the conductive elements 41, 43 but provides capacitive coupling between the elements 41, 43 and so, when a key is depressed, couples a row to a column circuit as previously described.

We claim:

1. In a keyboard having keys each carrying a conductive elastomeric striker which striker is movable, by depression of the key, towards conductive elements on a fixed member to effect capacitive coupling therebetween; the improvement comprising the provision, over said conductive elements, of dielectric material coated with conductive material in regions on its upper surface to be directly contacted by the striker, said conductive elements being adjacent to the other surface of the dielectric material, at least one conductive element being located opposite one of said conductive regions.

2. An ornamental device to be fastened to clothing and the like to hold glasses and other objects, said device comprising:
 a main body having an ornamental front surface;
 fastening means attached to the back surface of the main body for fastening the device to clothing and the like;
 holding means attached to the back surface of and hidden from frontal view by the ornamental front surface of said main body, said holding means extendable from the bottom edge of said main body for holding objects hung thereover, said holding means comprised of:
 two, parallel, vertical, tubular members spaced from each other and attached directly to the back of said main body, and
 a moveable U-shaped member frictionally fitted at each vertical section thereof into one of said vertical tubular members, with the horizontal member of the U-shape extending between the vertical sections beneath the vertical tubular members,
 whereby extending the U-shaped member beyond the edge of the main body while being frictionally held by the vertical tubular members provides a horizontal support at the bottom horizontal part of the U-shape for holding an object and whereby forcing the U-shaped member upward behind the ornamental front surface completely hides the U-shaped member from frontal view.

3. A keyboard as claimed in claim 1 and having at least two conductive elements, each on the underside of the dielectric material opposite one of said conductive regions on the upper side.

4. In a keyboard having keys each carrying a conductive striker element which is movable by the key towards conductive elements on a fixed member to effect coupling therebetween; the improvement comprising the provision of dielectric material over said conductive elements with at least one conductive element adjacent the lower surface of the dielectric material and with conductive regions on its upper surface to be directly contacted by the striker element, at least one of these regions being located opposite one of said conductive elements adjacent the other side of the dielectric, and wherein said conductive regions on the upper surface of the dielectric material are formed each as areas having a pattern of discrete conductive portions.

* * * * *

UNITED STATES PATENT OFFICE
CERTIFICATE OF CORRECTION

Patent No. 3,951,250          Dated April 20, 1976

Inventor(s) Peter Pointon; Ian R. Prince and Wolfgang Bial

It is certified that error appears in the above-identified patent and that said Letters Patent are hereby corrected as shown below:

Claim 2 should read:

--A keyboard as claimed in claim 1 wherein said conductive elements are on the dielectric material.--

Signed and Sealed this

Third Day of October 1978

[SEAL]

Attest:

RUTH C. MASON
*Attesting Officer*

DONALD W. BANNER
*Commissioner of Patents and Trademarks*